Sept. 1, 1970 W. PÜTZER 3,526,859

SINGLE CONTROL MULTIBAND VARIABLE CAPACITANCE DIODE TV TUNER

Filed April 10, 1968 2 Sheets-Sheet 1

INVENTOR.
WALTER PÜTZER
BY
Frank R. Trifari
AGENT

SINGLE CONTROL MULTIBAND VARIABLE CAPACITANCE DIODE TV TUNER

Filed April 10, 1968 2 Sheets-Sheet 2

INVENTOR.
WALTER PÜTZER
BY
AGENT

United States Patent Office 3,526,859

Patented Sept. 1, 1970

3,526,859

SINGLE CONTROL MULTIBAND VARIABLE CAPACITANCE DIODE TV TUNER

Walter Pützer, Krefeld, Germany, assignor, by mesne assignments, to U.S. Philips Corporation, New York, N.Y., a corporation of Delaware Filed Apr. 10, 1968, Ser. No. 720,304
Claims priority, application Germany, Apr. 29, 1967, P 42,041
Int. Cl. H03j 3/18, 5/24
U.S. Cl. 334—15 3 Claims

ABSTRACT OF THE DISCLOSURE

A multiple band tuning circuit has a plurality of resonant circuits each tuned by a separate capacitance diode. A constant potential, or potentials, is applied to one end of each diode, and the other end of each diode is connected to a common tap of a potentiometer. The potentiometer tunes the resonant circuits sequentially through their respective tuning ranges. Switching diodes, coupled respectively to each of the resonant circuits, disable the circuits not being tuned.

The invention relates to a circuit arrangement for tuning a receiver in at least two frequency ranges, a resonance circuit including a capacitance diode being provided for each frequency range and one electrode of said diode being connected to a reference potential with respect to DC-voltage, and a variable tuning voltage being applied to the other electrode which voltage, for reception in the frequency range for which the resonance circuit is provided, varies the capacitance of said capacitance diode for the purpose of tuning the resonance circuit and which voltage, for reception in the other frequency range switches off said resonance circuit for the purpose of range changing.

In receivers, for example, television receivers which must be tuned to a number of frequency ranges it has advantageously been found to carry out both the tuning and the range changing purely electronically. Due to the electronic tuning, for example, by means of capacitance diodes, an economy is obtained by omitting the frequently used but large and expensive mechanical variable capacitors. If in addition the range changing is carried out electronically, for example, by means of switching diodes, the construction of the tuning unit can be simplified considerably.

In order to economize also the mechanical switches for generating the switching voltages required for range changing it has previously been suggested to use the tuning voltage serving for tuning within a frequency range also as a switching voltage for the range changing. This may, for example, be effected in such manner that a capacitance diode is operated in the cut-off direction through a first range of variation of the tuning voltage thus ensuring the tuning and that the tuning voltage biases said diode in the pass direction through a second range of variation thus switching off the resonance circuit including the said capacitance diode for reception purposes.

In a known circuit arrangement of this kind a plurality of tuning potentiometers have been arranged the spindles of which are mechanically connected together and in which each tuning potentiometer supplies the tuning voltage required for the tuning of one capacitance diode.

An object of the invention is to avoid the required high cost of tuning potentiometers in this known arrangement, and the circuit arrangement according to the invention is characterized in that the variable tuning voltage is generated by a common tuning device for the resonance circuits associated with the various frequency ranges, and that the resonance circuit for a first frequency range includes a diode one electrode of which is connected to a reference potential with respect to DC-voltage and the variable tuning voltage is applied to the other electrode, said diode being circuited, in relation to the tuning voltage generated by the common tuning device, to have opposite polarity relative to the capacitance diode of the resonance circuit for the second frequency range.

It is noted in this respect that the common tuning device of the arrangement according to the invention for the various frequency ranges may include various tuning potentiometers for the purpose of channel-preselection. To this end various potentiometers connected in parallel with a supply voltage source and previously adjusted can be switched on as desired for tuning to the various channels.

In the simplest form of the arrangement according to the invention, the diode of the resonance circuit for the first frequency range is a variable capacitance diode serving for tuning said circuit, the reference potential corresponding at least substantially to the reference potential for the variable capacitance diode of the resonance circuit for the second frequency range.

This embodiment has, however, the drawback that upon passing through the range of variation of the tuning voltage, the first frequency range is first tuned from lower to higher frequencies and subsequently the second frequency range from higher to lower frequencies. This situation may be disadvantageous if, for example, a dial indication coupled to the tuning device is used, or if in addition a device for automatic fine tuning is included.

This drawback is obviated in one embodiment of the circuit arrangement according to the invention which, in addition to the variable capacitance diode, the resonance circuit for the first frequency range includes a switching diode of which the barrier layer capacitance with respect to the average barrier layer capacitance of the capacitance diode is negligible and in which the said switching diode is circuited, in relation to the tuning voltage, to have opposite polarity relative to that of the capacitance diode of the resonance circuit for the first frequency range.

Said arrangement is advantageously elaborated in such manner that the reference potential for the capacitance diode of the resonance circuit for the first frequency range and the reference potential for the capacitance diode of the resonance circuit for the second frequency range are adjusted to different values and that the reference potential for the switching diode of the resonance circuit for the first frequency range corresponds at least substantially to the refrence potential for the capacitance diode of the resonance circuit for the second frequency range.

It is often desirable to include trimming potentiometers in tuning units having capacitance diodes, in order to be able to trim the inevitable differences between the circuit elements, more particularly the capacitance diodes, and to be able to adjust the required synchronism of the various resonance circuits serving for the reception of a frequency range. To this end the adjustments which can be carried out with these trimming potentiometers must be independent from each other as much as possible. To this end a further embodiment of the arrangement according to the invention is characterized in that the reference potential for at least one capacitance diode is derived from an adjustable tapping of a first potentiometer which is connected to the tuning voltage on the one hand and to an adjustable tapping of a second potentiometer on the other hand, said second potentiometer being connected to the supply voltage source for the tuning device.

In order that the invention may be readily carried into effect, it will now be described in detail, by way of example, with reference to the accompanying diagrammatic drawings, in which.

Figure 1:
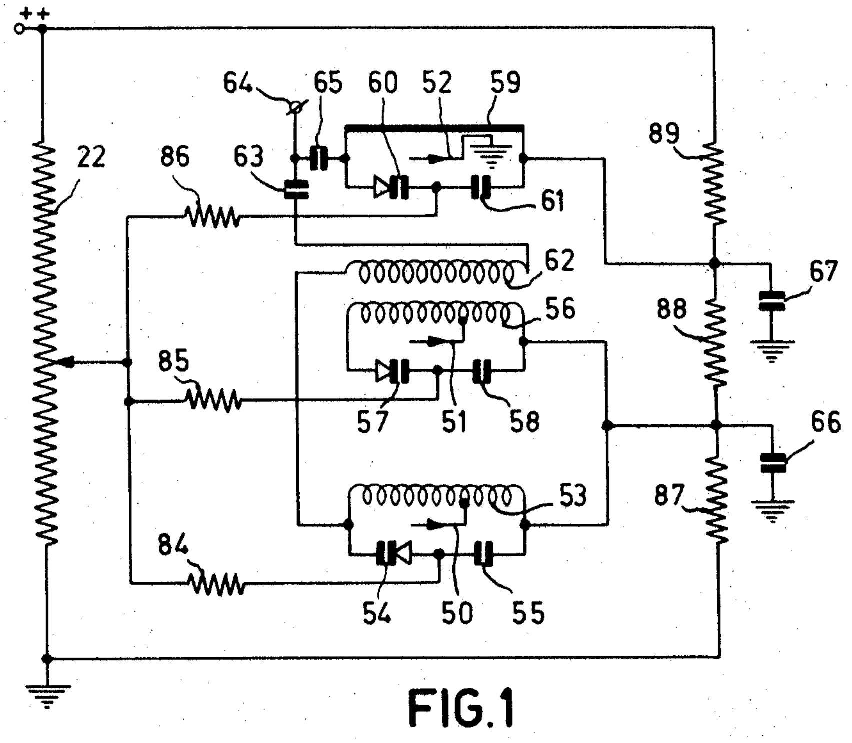
FIG. 1 shows a first embodiment according to the invention.

FIG. 1 shows a circuit arrangement according to the invention in which three channels for frequency ranges, for example, the television high frequency reception bands I, III and IV/V (in Europe approximately 40–60 mc./s., approximately 180–220 mc./s. and approximately 470–800 mc./s., respectively) are connected together. Thus it is, for example, possible to connect separated aerials to an amplifier or to connect an amplifier input to separated bandpass filter outputs, or an amplifier output to separated bandpass filter inputs.

In FIG. 1 the terminals 50, 51 and 52 are connected to output circuits of bandpass filters thus forming bandpass filter couplings. For band I an oscillatory circuit is formed between an inductance 53 to the tapping of which the terminal 50 is connected and, in parallel therewith, the series arrangement of the voltage-dependent capacitance diode 54 of the type BA 138 and a blocking capacitor 55 of 1000 pfs. The oscillatory circuit for band III is formed by an inductance 56 to the tapping of which the input terminal 51 is connected and with which a voltage-dependent capacitance diode 57 of the type BA 138 in series with a blocking capacitor 58 is connected in parallel. The capacitor 58 can have the same value as capacitors 55 and 61, but should be of a sufficient value to be a short circuit at VHF—III frequencies. The oscillatory circuits for the bands I and III are connected to earth with respect to alternating current through a capacitor 66. The resonance circuit for the UHF-range (IV/V) is formed by a line portion 59 with which a voltage-dependent capacitance diode 60 of the type BA 141 in series with a blocking capacitor 61 of 1000 pf. is connected in parallel. Said resonance circuit is connected to earth with respect to alternating current through a capacitor 67. The end of the inductance 53 not being connected to earth is connected through a coil 62 coupled to the inductance 56 and a series capacitor 63 of 33 pf. to the input terminal 64 of, for example, a subsequent transistor amplifier which is further connected to the lead portion 59 through a second series capacitor 65 of 2.2 pf.

The common points of the diodes 54, 57, 60 and the blocking capacitors 55, 58, 61 are connected to the slide contact of a tuning potentiometer 22 through series resistors 84, 85 and 86 while furthermore the ends of the inductances 53, 56 and 59 connected to the blocking capacitors 55, 58 and 61 are connected to tappings of a potentiometer circuit arrangement which consists of resistors 87, 88 and 89 and which is connected to the same voltage supply source as the tuning potentiometer 22.

In FIG. 1 the diodes 54 and 57 are connected with opposite polarity in such manner that the anode of the diode 54 connected to the blocking capacitor 55 is connected to series resistor 84 and the cathode of the diode 57 connected to the blocking capacitor 58 is connected to the series resistor 85, the oscillatory circuits including the inductances 53 and 56 are otherwise connected to the same tapping of the potentiometer between the resistors 87 and 88.

If the slide contact of the potentiometer 22 is placed at the lower end, the cathode of the diode 54 is positive so that said diode is cut off and has a minimum capacitance. The anode of the diode 57 is, however, connected to the more positive tapping of the potentiometer circuit 87, 88 and is thus conducting so that the associated oscillatory circuit is strongly damped and thus switched off by the conducting diode 57. If the slide contact of potentiometer 22 is moved upwards to more positive values, the condition of the diode 57 does not initially change but the diode 54 receives a smaller negative bias and thus shows a higher capacitance so that the band I-resonance circuit including the inductance 53 is tuned to a lower frequency. If the slide contact reaches and exceeds the potential point to which the tapping 87, 88 corresponds the anode of the diode 54 becomes positive relative to its cathode, so that the band I–resonance circuit is damped and switched off. On the other hand the cathode of the diode 57 becomes positive relative to its anode and is therefore biased in the cut-off direction so that the known voltage-dependent capacitance now occurs which results in tuning in band III.

In the situation described up till now the diode 60 is conducting and consequently the oscillatory circuit for the UHF-range with the lead portion 59 is also switched off. When the tuning potential has reached the value of the tapping between the resistors 88 and 89 the diode 60 is cut off and the connected oscillatory circuit in the UHF-range is tuned. In this range the diode 57 is then substantially adjusted to a minimum capacitance value and the connected oscillatory circuit is in resonance at a value outside the normal tuning range.

If it is necessary to tune to only the two VHF-bands I and III the UHF-oscillatory circuit arrangement can be omitted.

When tuning on band III the tuning impedance 54 for band I is shifted to values of low impedance, more particularly high damping, so that the resonance circuit 53, 54 is practically short-circuited for the oscillations of band III. The UHF-oscillatory circuit 59, 60 is also practically neutral due to the low inductance of the conductor 59 for these oscillations and furthermore is practically switched off by the series capacitor 65 of high impedance. As a result the resonance circuit 56, 57 is connected through its coupling coil 62 to the input 64 of the subsequent amplifier. If tuning is effected on band I, the UHF-circuit 59, 60 becomes neutral in the same manner. The tuning impedance 57 is then shifted to values of low impedance so that the coil 62 together with the circuit 56, 57 is operative as a small inductance for this range so that the transfer of oscillations from the circuit 53, 54 through the series capacitor 63 to the amplifier input 64 is simplified. In case of UHF-reception, the inductance 62 is of a sufficiently high impedance and blocks the resonance circuits 53, 54 and 56–57.

The circuit arrangement of FIG. 1 has a few drawbacks. In fact, in case of increasing tuning potential, consequently when shifting the potentiometer tapping possibly coupled to a pointer in a certain direction, for example, to a higher tuning potential the tuning frequency of the circuit including the inductance 53 is traversed in the reverse direction relative to the tuning frequencies of the circuits including the inductances 56 and 59. It is true that the tuning direction between the circuits including the inductances 56 and 59 is equal but the circuit including the inductance 56 when tuning the circuit including the inductance 59 for UHF-reception is not neutral due to damping but is only tuned to a frequency outside the reception band III.

Figure 2:
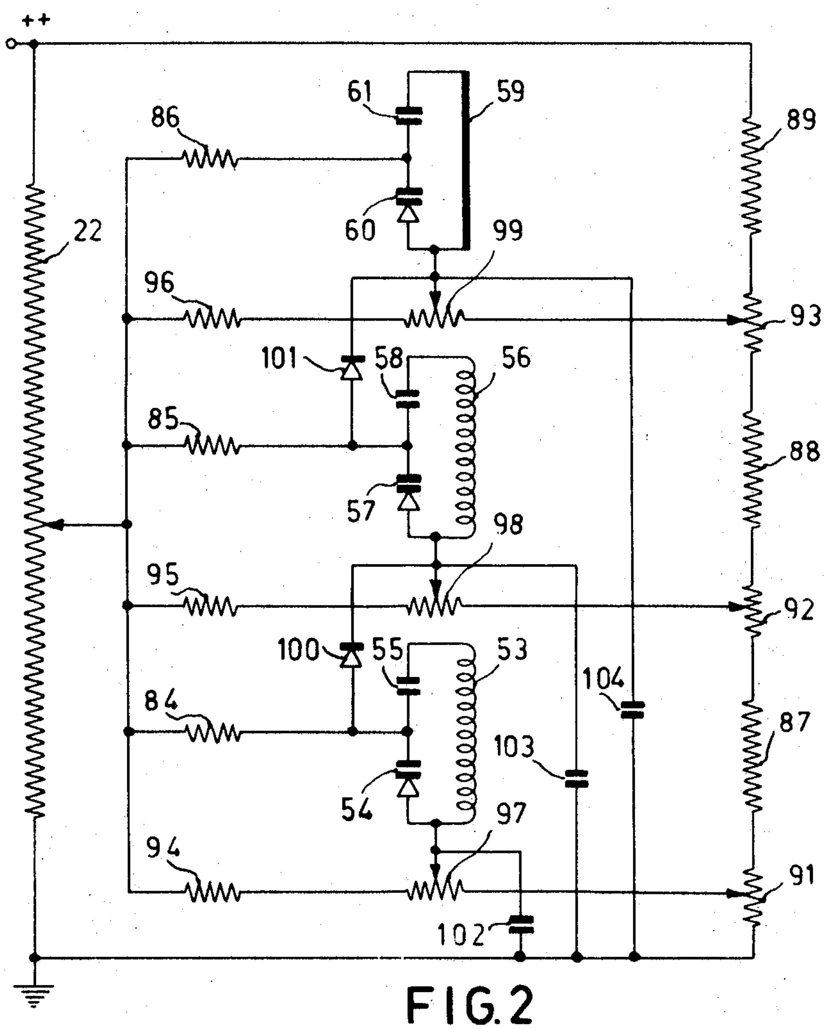
FIG. 2 shows a second embodiment of the invention.

These drawbacks may be solved by additional steps which are shown in FIG. 2, in which corresponding elements have the same reference numerals. FIG. 2 further shows the possibility to trim the potentials at the upper and lower ends of each tuning range in order to adjust the frequency ranges to a desired value. To this end the lower ends of the resonance circuits are not directly connected to tapping of a potentiometer circuit as shown in FIG. 1, but between earth and the potentiometer resistor 87, between the potentiometer resistors 87 and 88 and between the potentiometer resistors 88 and 89 there are included trimming potentiometers 91, 92 and 93, respectively, to the tappings of which three further potentiometers are connected relative to the tuning potential which consists of fixed resistors 94, 95 and 96 in series with trimming potentiometers 97, 98 and 99. The reference potential for the circuits including the inductances 53, 56 and 59 to be adjusted by means of the tuning potential are derived from the slide contacts of the potentiometers 97, 98 and 99. The reference potentials of the resonance circuits are connected to earth relative to high frequency through capacitors 102, 103 and 104, respectively. If the slide contact of the potentiometer 22 is adjusted to a value at which the associated oscillatory circuit must have a certain resonance frequency at a minimum diode voltage, only a small voltage is applied to the associated potentiometers 94, 97 and 95, 98 and 96, 99, respectively, and a trimming at the said lower end of the potential can be carried out by means of the associated potentiometers 91, 92 and 93. If the slide contact of the potentiometer 22 is adjusted to a value corresponding to the maximum diode voltage, the trimming at the said upper end of the potential is possible by means of one of the potentiometers 97, 98 or 99.

The in- and out-couplings of the signals are not further shown in FIG. 2 and may be brought about, for example, in the same manner as in the circuit arrangement of FIG. 1 with the elements 62, 63 and 65.

In order that all oscillatory circuits with a potential variation in the same direction also show a frequency variation in the same direction and frequency markings thus have the same course of direction on a voltage indicator, the diodes 54, 57 and 60 in FIG. 2 are of the same polarity relative to the tuning potential.

In order to switch off by damping the oscillatory circuits which are not required even if the subsequent reception range of higher frequency is tuned to, switching diodes 100 and 101 are arranged between the cathode of the diode 54 and the reference potential point of the oscillatory circuit including the diode 57 and further between the cathode of the diode 57 and the reference potential point of the oscillatory circuit including the diode 60, which switching diodes are connected in parallel to the diodes 54 and 57 through the capacitors 102, 103 and 104 relative to high frequency and have a high impedance and negligibly small capacitance in the cut-off condition. During passing through the frequency range of the resonance circuit 53–54, the diodes 100 and 101 are cut off as the capacitance diode 54 by means of which the tuning is carried out. The resonance circuits 56–57 and 59–60 are damped by the conducting capacitance diodes 57 and 60, respectively. If the tuning range of the circuit including the inductance 53 has then been traversed and the tuning potential has assumed a value which is more positive than the reference potential of the oscillatory circuit including the inductance 56, the capacitance diode 57 is cut off so that the tuning of the resonance circuit 56–57 is carried out by means of this diode. The diode 100 is then adjusted in the forward direction and operates as a damping for the circuit including the inductance 53. If finally the slide contact of the tuning potentiometer is still further shifted to more positive voltages and the tuning potential exceeds the reference potential of the circuit 59 then the diode 101 becomes conducting so that the resonance circuit 56–57 is damped. In addition the capacitance diode 60 changes from the conducting condition to cut-off condition so that the circuit 59–60 is tuned.

It should be noted that the diodes 100 and 101 become conducting as soon as the tuning potential of the slide contact on the potentiometer 22 has reached a higher value than that which corresponds to the slide contact of the adjusting potentiometers 98 and 99 connected to the cathode of the relevant switching diode. It is then achieved that the diodes 54 and 57 are adjusted to a fixed capacitance value in the cut-off direction for tuning above their actual tuning range. The auxiliary diodes 100 and 101 thus cause to a certain extent a voltage drop across the resistors 84 and 85 so as to avoid further variation of the tuning potential of the diodes 54 and 57 outside the range.

The cathodes of the diodes 100 and 101 may be connected instead of to the reference potential of the resonance circuits 56–57 and 59–60 to a potential slightly deviating from said reference potential. It is thus possible, for example, to connect the cathode of the diode 100 to the slide contact of the adjusting potentiometer 92 or to the common point of the potentiometer 92 and the resistor 87.

It may be advantageous to connect the cathodes of the diodes 100 to 101 to an adjustable potential, for example, to a slide contact on the resistors 87 and 88, which is preferably independent of the adjusting potentiometers 92, 98, 93 and 99. It is then possible to adjust the capacitance diodes 54 and 57 outside their tuning range to various values. This may particularly be important for oscillatory circuits associated with the same range in several stages; if these are tuned to different frequencies while being out of operation, the risks of undesired feedbacks decreases and consqeuently also the risk of amplification of oscillations lying outside the normal channels. Also faulty mixing of the oscillator and undesired formation of combination oscillations can thus certainly be avoided in a simple manner.

What is claimed is:

1. A multiple band tuning system comprising first and second resonant circuits, each of said first and second resonant circuits including a voltage dependent capacitance diode as a tuning element, first means connecting one end of the same polarity of each of said diodes to different points of constant potential, a source of potential having first and second terminals, potentiometer means connected between said first and second terminals and having a common tap that is adjustable to potentials that are positive and negative with respect to the constant potentials to which said one ends of said diodes are connected, separate resistor means for connecting the outer ends of said diodes to said common tap, whereby in a first region of adjustment of said tap the diodes of said first and second resonant circuits are cut-off and conducting respectively, and in a second region of adjustment of said tap the diodes of said first and second resonant circuits are cut-off, switching diode, means connecting the anode of said switching diode to the cathode of the capacitance diode of said first resonant circuit, and means connecting the cathode of said switching diode to the anode of the capacitance diode of said second resonant circuit.

2. A system as claimed in claim 1 wherein said first connecting means comprises adjustable resistor means.

3. A system as claimed in claim 1 further comprising means for adjusting said constant potentials.

References Cited

UNITED STATES PATENTS

| | | | |
|---|---|---|---|
| 3,103,637 | 9/1963 | Pan | 334—15 X |
| 3,118,116 | 1/1964 | Freedman | 334—11 X |

FOREIGN PATENTS

| | | |
|---|---|---|
| 896,865 | 3/1944 | France. |
| 1,082,134 | 6/1954 | France. |
| 1,225,715 | 9/1966 | Germany. |
| 1,240,955 | 3/1967 | Germany. |
| 1,248,758 | 8/1967 | Germany. |

OTHER REFERENCES

Limann, "Prüffeldmebtechnik," 1947, pp. 150 S and H, "Taschenbuch für Messen und Regeln," 1960, pp. 154–155.

HERMAN KARL SAALBACH, Primary Examiner

W. H. PUNTER, Assistant Examiner

U.S. Cl. X.R.

325—462; 334—55